US005533135A

United States Patent [19]

Gary

[11] Patent Number: 5,533,135

[45] Date of Patent: Jul. 2, 1996

[54] CROSSOVER SYSTEM

[76] Inventor: Phillip A. Gary, P.O. Box 71770, Madison Heights, Mich. 48071

[21] Appl. No.: 419,189

[22] Filed: Apr. 10, 1995

[51] Int. Cl.$^6$ .......... H03G 5/00

[52] U.S. Cl. .......... 381/99; 381/89; 381/100

[58] Field of Search .......... 381/99, 100, 89

[56] References Cited

U.S. PATENT DOCUMENTS

| | | | |
|---|---|---|---|
| 3,838,215 | 9/1974 | Haynes | 179/1 D |
| 4,237,340 | 12/1980 | Klipsch | 179/1 D |
| 4,282,402 | 8/1981 | Liontonia | 179/1 D |
| 4,593,405 | 6/1986 | Frye et al. | 381/99 |
| 4,606,071 | 8/1986 | White | 381/99 |
| 4,771,466 | 9/1988 | Modafferi | 381/100 |
| 5,129,006 | 7/1992 | Hill et al. | 381/100 |
| 5,384,856 | 1/1995 | Kyouno et al. | 381/99 |

*Primary Examiner*—Forester W. Isen
*Assistant Examiner*—Duc Nguyen
*Attorney, Agent, or Firm*—Charles W. Chandler

[57] ABSTRACT

An audio crossover system having two crossover networks, one suited to the auditory preferences of women and the other to the auditory preferences of men. The former attenuates mid-range frequencies more than high-range frequencies and attenuates low-range frequencies still more. The latter attenuates mid-range frequencies more than low-range frequencies and attentuates high-range frequencies even more than those in the mid-range.

6 Claims, 1 Drawing Sheet

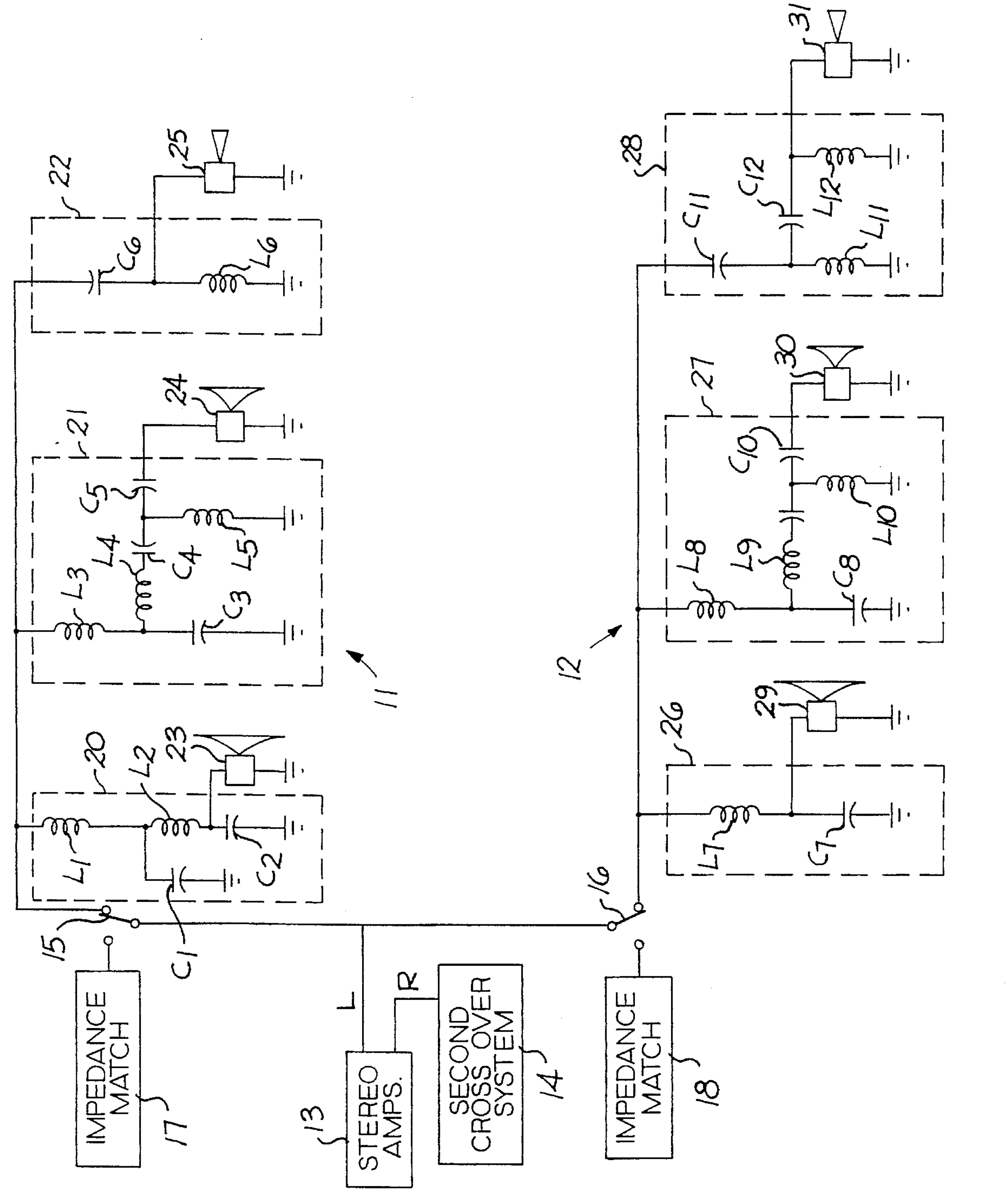
IMPEDANCE MATCH
17
STEREO AMPS.
13
SECOND CROSS OVER SYSTEM
14
IMPEDANCE MATCH
18
L
R
15
16
C1
L1
L2
C2
20
23
L3
L4
C4
C3
C5
L5
21
24
C6
L6
22
25
11
12
L7
C7
26
29
L8
L9
C8
L10
C10
27
30
C11
C12
L11
L12
28
31

CROSSOVER SYSTEM

BACKGROUND OF THE INVENTION

1. Field of the Invention

This invention relates to the field of crossover systems for use in audio amplifier systems. In particular, it relates to crossover networks that provide separate frequency responses suited to the different auditory sensitivity characteristics of male and female listeners.

2. The Prior Art The use of audio amplifiers with output circuits having multi-range crossover networks to supply different parts of a total band of frequencies to different loudspeakers, each designed to handle the part of the spectrum of frequencies directed to it, is well known. Illustrative examples of such networks are to be found in the following U.S. patents:

| U.S. Pat. No. | Issued | Inventor |
|---|---|---|
| 3,838,215 | Sep. 24, 1974 | Haynes, Jr. |
| 4,237,340 | Dec. 2, 1980 | Klipsch |
| 4,282,402 | Aug. 4, 1981 | Liontonia |
| 4,593,405 | Jun. 3, 1986 | Frye et al. |
| 4,606,071 | Aug. 12, 1986 | White, Jr. |
| 4,771,466 | Sep. 13, 1988 | Modaferri |
| 5,129,006 | Jul. 7, 1992 | Hill et al. |

Frye et al. and White Jr. disclose loudspeaker systems in which there are crossover circuits for separating audio signals into two bands: an upper band to drive a tweeter and a lower band to drive a woofer. Haynes, Jr., Klipsch, Liontonia, Modaferri, and Hill et al. disclose systems with crossover networks arranged to separate the audible range of frequencies into three bands, the middle band being used to drive a third speaker.

The crossover networks in all of these patents provide different filtering characteristics and the networks are suitable for operation in stereo systems in which the sounds reproduced by speaker systems on the listener's left are different from those reproduced by speaker systems on the listener's right at any given instant. However, there is no suggestion of providing two sets of crossover networks having different frequency response characteristics based on physiological differences in the auditory response of male and female listeners. In the case of existing stereophonic systems, the crossover networks controlling signals to speaker systems on the left will be the same as the crossover networks controlling signals to speaker systems on the right.

Quadraphonic speaker systems have also been produced in which there are speakers on the left and right in front of a listener and on the left and right behind the listener. In such systems, it is common to attenuate the higher frequency components of audio signals supplied to speakers behind the listeners in comparison with those same components of the same audio signals supplied to speakers in front of the listeners. As in the case of stereophonic systems, the quadraphonic signals are not further modified to accommodate physiological differences in male and female listeners.

I have found that women prefer that the sounds reproduced by a speaker system be accentuated in the higher part of the audible range and attenuated in the lower part relative to sounds in the middle range of frequencies between those in the higher and lower parts of the audible range, and that men have just the reverse preference.

OBJECTS AND SUMMARY OF THE INVENTION

It is an object of this invention to provide a speaker system in which there is a crossover network arranged in two parts, one part to drive a set of speakers in which signals in a low band of frequencies are amplified less than signals in a middle band of frequencies above the low band and still less than signals in a higher band, in accordance with the preferences of women listeners, and the other part to drive another set of speakers in which signals in the low band of frequencies are amplified more than signals in the middle band and still more than signals in the higher band to produce an overall frequency response characteristic preferred by men.

Another object is to arrange the two parts of the aforementioned crossover network so that the difference in amplification (or attenuation) between signals in one of the frequency bands and another frequency band in one part of the network is complementary to the amplification (or attenuation) of the same signals in the same bands in the other part of the network.

A further object is to arrange the aforementioned network so that the difference in amplification (or attenuation) of signals in the lower band of frequencies relative to the amplification (or attenuation) in the middle band in one part of the network is substantially equal to the difference between the amplification (or attenuation) of frequencies in the middle band of frequencies relative to the amplification (or attenuation) in the higher band of frequencies in the same part.

Those who are skilled in the technology with which this invention deals will recognize further objects after studying the following description.

In accordance with this invention a crossover system is provided in two parts, each of which is supplied with the same audio signals. One part controls a first multi-speaker reproduction system having frequency characteristics preferred by women, and the other controls a second multi-speaker reproduction system having frequency characteristics preferred by men. The two speaker systems, if used in a stereo system, are preferably located close to each other so as not to confuse the apparent sources of sound being reproduced. That is, the speaker system reproducing sounds apparently coming from the listener's left and having frequency response characteristics preferred by women should be placed closed to the speaker system reproducing sounds apparently coming from the listener's left and having frequency response characteristics preferred by men. The women's and men's speaker systems for sounds apparently coming from the right should likewise be spaced close to each other, although adequately spaced from the speaker systems on the left in accordance with standard stereo practice.

The part of the crossover system having an overall frequency response characteristic preferred by women, attenuates signals in the low frequency range relative to signals in the middle frequency range by same amount as signals in the middle frequency range are attenuated relative to those in the higher frequency range. In the part of the crossover system having a frequency response characteristic preferred by men, the attenuation from range to range is the converse of that in the crossover system for women, providing approximately equal amounts of attenuation from low to middle and middle to high. In addition, the number of db. in each step of attenuation from range to range in the first part of the crossover system is substantially equal to the number of db. (although opposite in value) of attenuation from range to range in the second part of the crossover system.

The invention will be described in greater detail in connection with the drawings, in which like serial numbers in different figures indicate the same item.

BRIEF DESCRIPTION OF THE DRAWINGS

The drawing illustrating this invention is a schematic diagram of two crossover networks, one arranged to handle audio frequency signals in a manner suitable for women and the other arranged to handle audio frequency signals in a manner suitable for men.

DETAILED DESCRIPTION OF A PREFERRED EMBODIMENT

The crossover system of this invention includes a network 11 having frequency response characteristics that have been found to be particularly satisfactory to women and a network 12 having frequency response characteristics particularly satisfactory to men. Both networks are connected to a set of stereo amplifiers 13 to reproduce the same audio signals, which would typically be one side, in this case the left side, of a stereophonic presentation. An identical crossover system 14 is shown connected to the amplifiers 13 to reproduce audio signals of the other side of the same stereophonic presentation, although the concept embodied in the crossover networks 11 and 12 is equally suitable for a monophonic presentation as well as for a quadraphonic presentation.

The crossover networks 11 and 12 are connected to the amplifiers 13 by way of switches 15 and 16 that allow either the men's crossover network 12 or the women's crossover network 11 to be disconnected from the amplifiers 13 without affecting the other crossover network 11 or 12, respectively. These switches 15 and 16 are double-pole, double-throw switches, only one pole of which is shown. The other pole of each switch is connected between the right-hand output terminal of the amplifiers 13 and the second crossover system 14 so that both the left-hand and right-hand signals of the men's system or the left-hand and right-hand signals of the women's system will be disconnected simultaneously. It would create an incorrect sound if, for example, only the crossover network 11 for the left-hand sounds .were disconnected and the corresponding crossover network for the right-hand sounds in the system 14 were not disconnected.

Impedance matching devices 17 and 18 are connected to alternative terminals of the switches 15 and 16, respectively, to maintain the proper impedance for the amplifiers 13 when either the crossover network 11 or the crossover network 12 is disconnected.

The women's crossover network 11 comprises three sections 20-22 that pass signals in low, middle, and high audio frequency bands, respectively. The section 20 is connected to a low-range speaker, or woofer, 23 that has a matching impedance. Section 20 is a low-pass filter that has an attenuation slope preferably of about 18 to 24 db./octave at an upper crossover frequency within a range of about 600 Hz to about 750 Hz. This filter has two stages consisting of inductances $L_1$ and $L_2$ and capacitors $C_1$ and $C_2$. While the filter 20 has no lower cutoff frequency, the speaker typically is capable of reproducing sounds only down to about 20 Hz, although that is merely illustrative. Some woofers are capable of reproducing sounds having even lower frequencies, and others are not capable of going down to 20 Hz. It must be recognized that the desired sound quality may require the use of more than one speaker, appropriately connected to maintain an impedance match, at any of the points in this system in which reference is made to a speaker.

The filter section 21, which transmits audio signals to a midrange speaker 24 that is typically capable of reproducing sounds in the frequency range from about 500 Hz to about 5 KHz, has a passband that extends from a lower crossover frequency between about 600 Hz and about 750 Hz to an upper crossover frequency of about 4 KHz to about 4.5 KHz with attenuation slopes preferably of about 18 db/octave at both the lower and upper crossover frequencies. This filter is basically an m-derived filter comprising inductances $L_3$-$L_5$ and capacitors $C_3$-$C_5$, the values of which are chosen to provide the desired passband and to match the impedance of the speaker 24.

The filter section 22 includes capacitor $C_6$ and inductance $L_6$ in an L-section high-pass filter with an attenuation slope of about 12 db/octave at a frequency in the range of about 4 KHz to about 4.5 KHz, and it is connected to a high-range speaker 25. This speaker is typically a horn speaker capable of reproducing sounds from about 4 KHz to about 20 KHz, or more.

I have found it desirable for the filter section 21 to introduce a loss of about 4 to 6 db. and preferably 5 db. relative to the filter section 20, and the filter section 22 to introduce a loss of about 4 to 6 db. and preferably 5 db. relative to the section 21.

Like the women's network 11, the men's crossover network 12 comprises three sections 26-28 that pass signals in low, middle, and high audio frequency bands, respectively. The section 26 is a low-pass filter but its attenuation slope is preferably less than that of the low-range section 20 of the women's network 11 and is typically about 12 db./octave at an upper crossover frequency within a range of about 450 Hz to about 600 Hz. The filter section 22 includes capacitor $C_6$ and inductance $L_6$ in an L-section high-pass filter and it is connected to a low-range, or woofer, speaker 29 that has an impedance that matches the filter section 26. While the filter 26 has no lower cutoff frequency, the speaker 29 typically is capable of reproducing sounds only down to about 20 Hz, although that is merely illustrative.

The filter section 27, which transmits audio signals to a midrange speaker 30 that is typically capable of reproducing sounds in the frequency range from about 500 Hz to about 5 KHz, has a passband that extends from a lower crossover frequency between about 450 Hz and about 600 Hz to an upper crossover frequency of about 3.5 KHz to about 4 KHz with attenuation slopes preferably of about 18 db/octave at both the lower and upper crossover frequencies. This filter is basically an m-derived filter comprising inductances $L_8$-$L_{10}$ and capacitors $C_8$-$C_{10}$, the values of which are chosen to provide the desired passband and to match the impedance of the speaker 30.

Section 28 is a high-pass filter that has an attenuation slope preferably of about 18 to 24 db./octave at a lower crossover frequency within a range of about 3.5 KHz to about 4 KHz. This filter has two stages consisting of inductances $L_{11}$ and $L_{12}$ and capacitors $C_{11}$ and $C_{12}$. The effective upper limit of frequencies reproduced through the filter section 28 is not determined by the filter but by a high-range speaker 31 to which signals that pass through the filter are supplied. This speaker is typically a horn speaker capable of reproducing sounds from about 4 KHz to about 20 KHz, or more.

I have found it desirable for the filter section 28 to introduce a loss of about 4 to 6 db. and preferably 5 db.

relative to the filter section 27, and the filter section 27 to introduce a loss of about 4 to 6 db. and preferably 5 db. relative to the section 26.

Typical values for the components in the filter sections 20-22 and 26-28 are listed in Table I:

TABLE I

| | | | |
|---|---|---|---|
| $C_1$ | 39.4μ | $C_2$ | 8.9μ |
| $C_3$ | 2.73μ | $C_4$ | 12.4μ |
| $C_5$ | 38μ | $C_6$ | 0.8μ |
| $C_7$ | 20μ | $C_8$ | 6μ |
| $C_9$ | 21μ | $C_{10}$ | 66μ |
| $C_{11}$ | 1.5μ | $C_{12}$ | 2μ |
| $L_1$ | 11.9 mH | $L_2$ | 6 mH |
| $L_3$ | .4 mH | $L_4$ | .17 mH |
| $L_5$ | 5.1 mH | $L_6$ | .25 mH |
| $L_7$ | .9 mH | $L_8$ | 2 mH |
| $L_9$ | .123 mH | $L_{10}$ | 1.48 mH |
| $L_{11}$ | .358 mH | $L_{12}$ | .25 mH |

The invention has been described in terms of a specific embodiment, but it will be apparent to those skilled in the technology with which this invention deals that the concept may be embodied in other forms without departing from the true scope of the invention.

What is claimed is:

1. A speaker system to be connected to a source of audio signals to produce audible sounds from the signals, the system comprising:

(a) a first set of loudspeakers comprising first, second and third speakers (23, 24, 25);

(b) a first crossover network connected to the first set of speakers and comprising:

(i) means (20) to transmit to the first speaker audio signals in a first range of audio frequencies below a first frequency to produce sound pressure at a first selected low level, (ii) means (21) to transmit to the second speaker audio signals in a second range of audio frequencies above the first frequency and below a second frequency to produce sound pressure at a second selected intermediate level higher than the first selected sound pressure level, and (iii) means (22) to transmit to the third speaker audio signals in a third range of audio frequencies above the second frequency to produce sound pressure at a third selected level higher than the second selected sound pressure level;

(c) a second set of loudspeakers comprising fourth, fifth, and sixth speakers (26, 27, 28); and (d) a second crossover network connected to the second set of speakers and comprising:

(i) means (26) to transmit to the fourth speaker audio signals in the first range of audio frequencies to produce sound pressure at substantially the third selected level, (ii) means (27) to transmit to the fifth speaker audio signals in the second range of audio frequencies to produce sound pressure at substantially the second selected level, and (iii) means (28) to transmit to the sixth speaker audio signals in the third range of audio frequencies to produce sound pressure at substantially the first selected level.

2. The speaker system of claim 1, wherein the difference between the first and second sound pressure levels is approximately five decibels, and the difference between the second and third sound pressure levels is approximately five decibels.

3. The speaker system of claim 1, wherein the first and second sets of speakers are connected in parallel to the audio signal source; said speaker system further comprising first switch means (15) for selectively disconnecting said first set of speakers from the audio signal source, and a second switch means (16) for selectively disconnecting said second set of speakers from the audio signal source.

4. A speaker system to be connected to a source of audio signals to produce audible sounds from the signals, the system comprising:

(a) a first set of loudspeakers comprising first and second speakers;

(b) a first crossover network connected to the first set of speakers and comprising:

(i) means to transmit audio signals in a first range of audio frequencies below a first frequency to the first speaker to produce sound pressure at approximately a first level, and (ii) means to transmit audio signals in a second range of audio frequencies above the first frequency to the second speaker to produce sound pressure at approximately a second level, the second level being higher than the first level by a predetermined amount;

(c) a second set of loudspeakers comprising third and fourth speakers; and (d) a second crossover network connected to the second set of speakers and comprising:

(i) means to transmit audio signals in the first range of audio frequencies to the third speaker to produce sound pressure at approximately the second level, and (ii) means to transmit audio signals in the second range of audio frequencies above the first frequency to the fourth speaker to produce sound pressure at approximately the first level.

5. The speaker system of claim 4, wherein the difference between the first and second sound pressure levels is approximately five decibels.

6. The speaker system of claim 4, wherein the first and second sets of speakers are connected in parallel to the audio signal source; said speaker system further comprising first switch means (15) for selectively disconnecting said first set of speakers from the audio signal source, and a second switch means (16) for selectively disconnecting said second set of speakers from the audio signal source.

* * * * *